United States Patent
Cole et al.

(10) Patent No.: US 7,038,505 B2
(45) Date of Patent: May 2, 2006

(54) CONFIGURABLE ENABLING PULSE CLOCK GENERATION FOR MULTIPLE SIGNALING MODES

(75) Inventors: Ying Cole, Portland, OR (US);
Songmin Kim, Beaverton, OR (US);
Robert Greiner, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 46 days.

(21) Appl. No.: 10/750,558

(22) Filed: Dec. 31, 2003

(65) Prior Publication Data

US 2005/0141666 A1   Jun. 30, 2005

(51) Int. Cl.
*H03L 7/00* (2006.01)

(52) U.S. Cl. ............... 327/141; 327/144; 327/291

(58) Field of Classification Search .............. None
See application file for complete search history.

(56) References Cited

U.S. PATENT DOCUMENTS

| | | | |
|---|---|---|---|
| 6,055,587 A * | 4/2000 | Asami et al. | 710/49 |
| 6,591,319 B1 * | 7/2003 | Kurd et al. | 710/100 |
| 2001/0009435 A1 * | 7/2001 | Nagumo | 347/237 |
| 2004/0143773 A1 * | 7/2004 | Chen | 713/400 |

* cited by examiner

*Primary Examiner*—Tuan T. Lam
(74) *Attorney, Agent, or Firm*—Schwabe, Williamson & Wyatt, P.C.

(57) ABSTRACT

Enabling pulse clocks are configurably generated for a selected one of a first and a second signaling mode, employing a configurable enabling pulse clock generator configurable to so generate the enabling pulse clocks.

17 Claims, 11 Drawing Sheets

CONFIGURABLE ENABLING PULSE CLOCK GENERATION FOR MULTIPLE SIGNALING MODES

FIELD OF THE INVENTION

The present invention is related to the field of integrated circuits, and, more particularly, to input sections of integrated circuits.

BACKGROUND OF INVENTION

In the current state of integrated circuit technology, there are at least two types of data input signaling modes, single-ended signaling mode and differential signaling mode. Currently, for a variety of reasons, the former tends to be favored by the lower speed, higher voltage integrated circuits, while the later tends to be favored by the higher speed, lower voltage integrated circuits. The differences between the two signaling modes create difficulties for designing the input sections of the integrated circuits of the different types, especially since they often have to co-exist and co-operate with each other in the same system.

BRIEF DESCRIPTION OF DRAWINGS

Embodiments of the present invention will be described referencing the accompanying drawings in which like references denote similar elements, and in which.

DETAILED DESCRIPTIONS OF EMBODIMENTS OF THE INVENTION

Embodiments of the present invention include but are not limited to a micro-architecture for an input section of an integrated circuit (IC), such as a CPU and/or a Chipset, that may be configured to support either differential or single-ended signaling mode of source synchronous data transfer/signaling, ICs having such input sections, and systems having such ICs.

In the following detailed description, various aspects of the embodiments of the invention will be described. However, it will be apparent to those skilled in the art that other embodiments may be practiced with only some or all of these aspects. For purposes of explanation, specific numbers, materials and configurations are set forth in order to provide a thorough understanding of these embodiments. However, it will also be apparent to one skilled in the art that other embodiments may be practiced without the specific details. In other instances, well-known features are omitted or simplified in order not to obscure the description.

Figure 1:
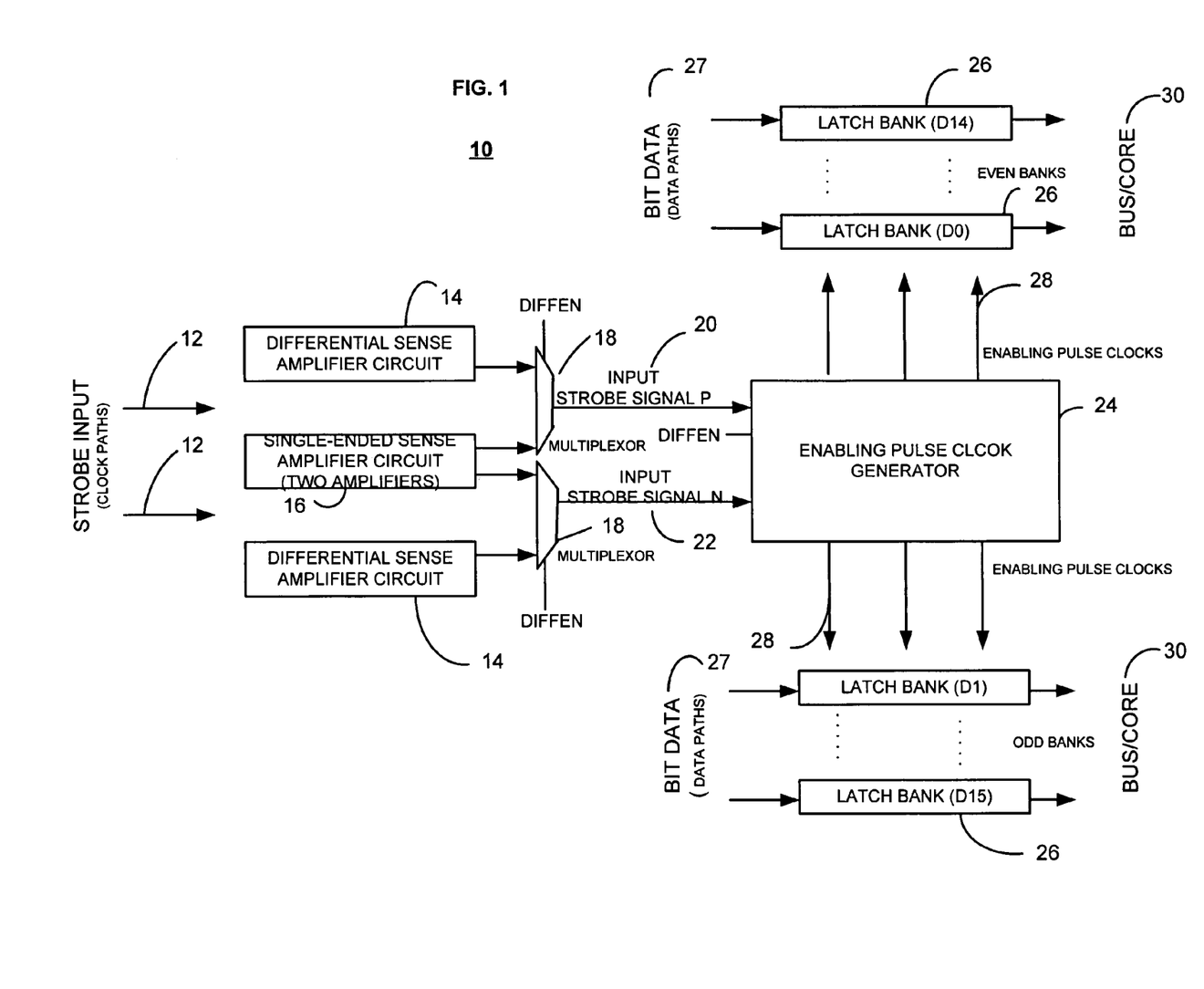
FIG. 1 is a block diagram of an input section of an integrated circuit, including a configurable enabling pulse clock generator, according to some embodiments of the invention.

FIG. 1 is a block diagram of an input section 10 of an integrated circuit (IC), according to some embodiments of the present invention. As illustrated, input section 10 includes a number of latch banks 26, enabling pulse clock generator 24, multiplexors 18, and sense amplifier circuits 14 and 16 coupled to each other as shown.

Latch banks 26 may be employed to latch and temporarily store the data being transferred to the IC. The latch banks 26 may operate in accordance with enabling pulse clocks 28. The latch banks 26 may, for example, be employed to latch bit data off input data paths 27, hold them temporarily, and then transfer them onto a data bus 30. For ease of understanding, the embodiment is illustrated with 16 latch banks, organized as two groups of 8. The two groups are referred to as even banks and odd banks. Other embodiments may have more or less latch banks, as well as having the latch banks organized in other manners.

An enabling pulse clock generator 24 may be employed to provide latch banks 26 with enabling pulse clocks 28 to control their operations. The enabling pulse clock generator 24 may provide enabling pulse clocks 28 in accordance with at least strobe signals P 20 and N 22. As will be described in more detail below, enabling pulse clock generator 24 may be designed to be configurable (e.g. per control signal Diffen) to provide enabling pulse clocks 28 further in accordance with a selected one of at least the single-ended signaling mode and the differential signaling mode.

Resultantly, input section 10 including latch banks 26 may be configurable for use for an input section of an IC to facilitate data transfer via single-ended signaling, or another input section of another IC to facilitate data transfer via differential signaling. Additionally, input section 10 may also be used in an IC to enable the IC to be configurable to support either single-ended or differential signaling.

Sense amplifier circuits 14 and 16 (two each) are employed to provide strobe signals P 20 and N 22 to Enabling Pulse Clock Generator 24 for the differential signaling mode and the single-ended signaling mode, respectively. That is, strobe signal P 20 is provided to Enabling Pulse Clock Generator 24 for the diffreintial signaling mode, and strobe signal N 22 is provided to Enabling Pulse Clock Generator 24 for the single-ended signaling mode. Both sinse amplifier circuits 14 and 16 provide strobe signals P 20 and N 22 in accordance with at least strobe inputs 12.

Figure 2A:
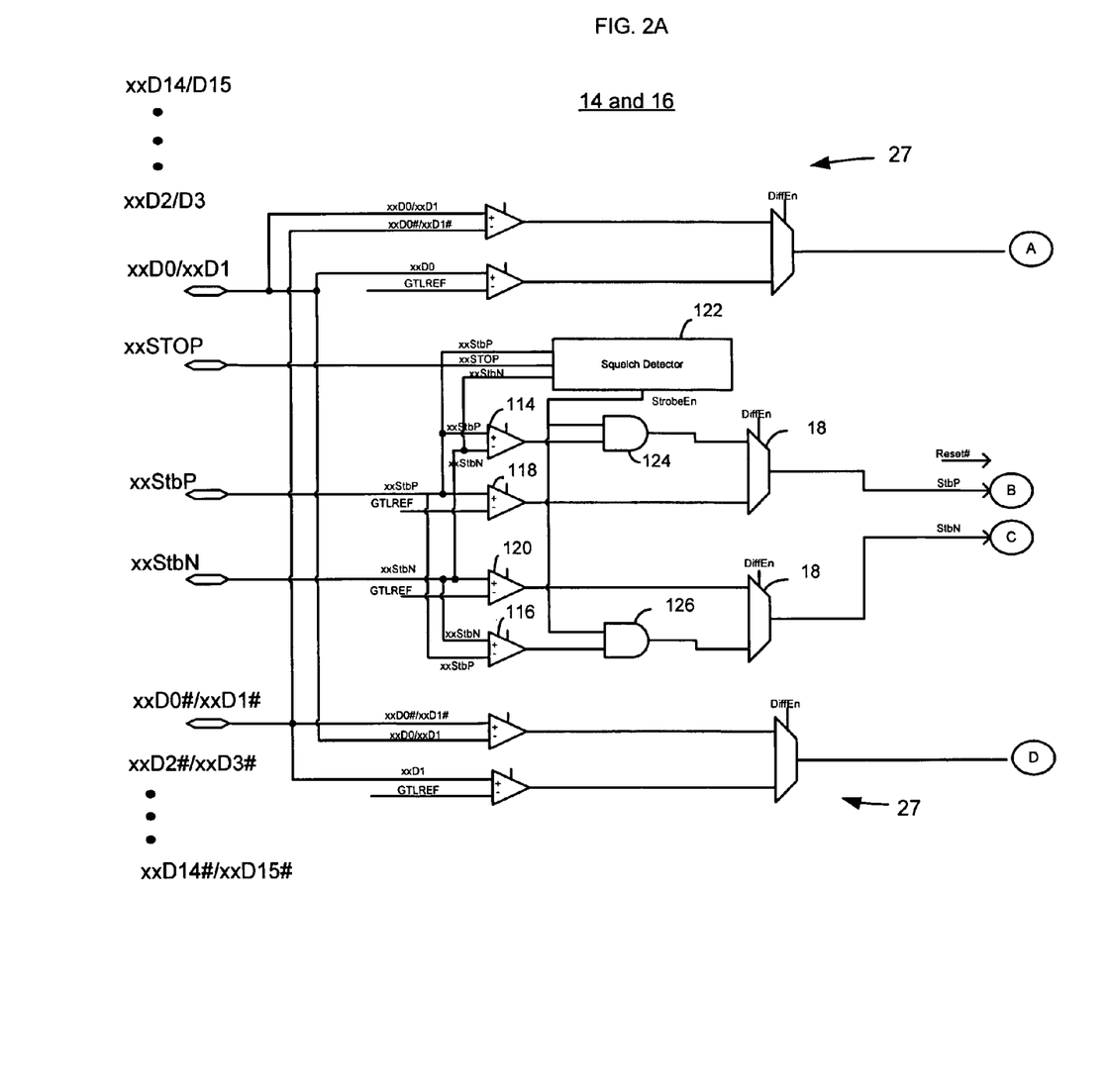
FIGS. 2A and 2B illustrate the input section of FIG. 1 in further detail, in particular, the sense amplifier circuits and the latch banks, according to some embodiments of the invention.
Figure 2B:
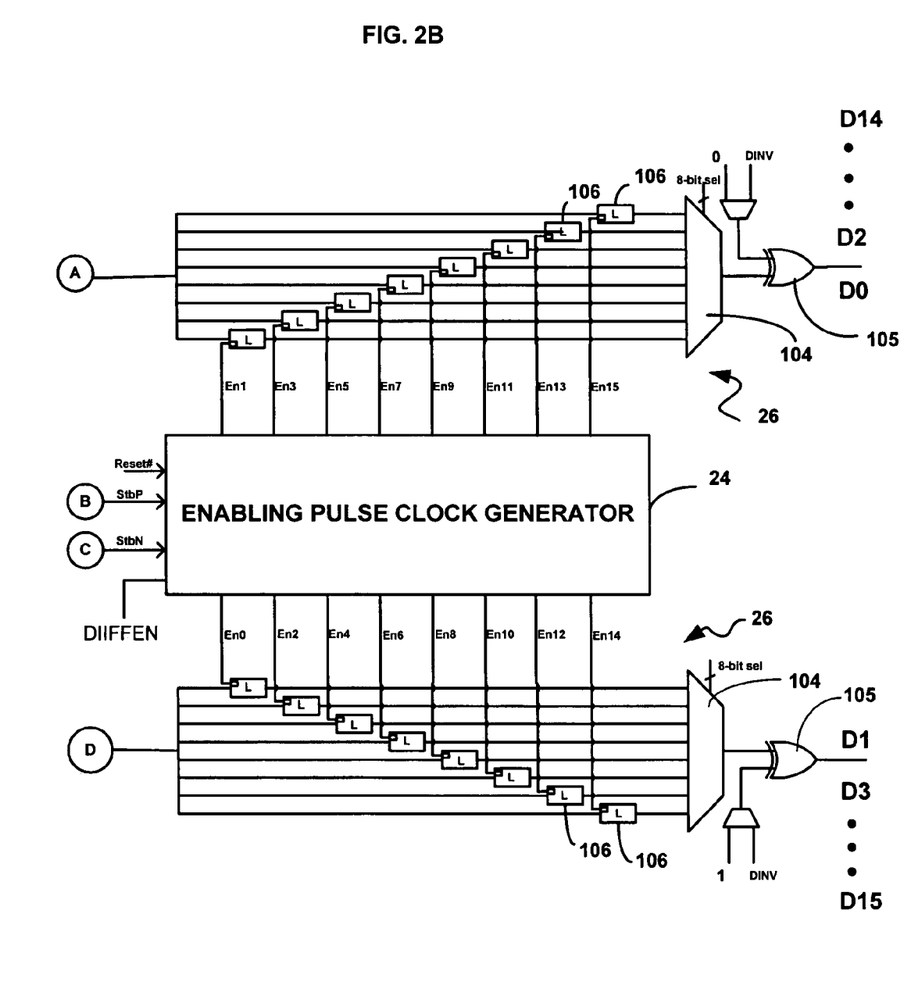
Figure 2C:
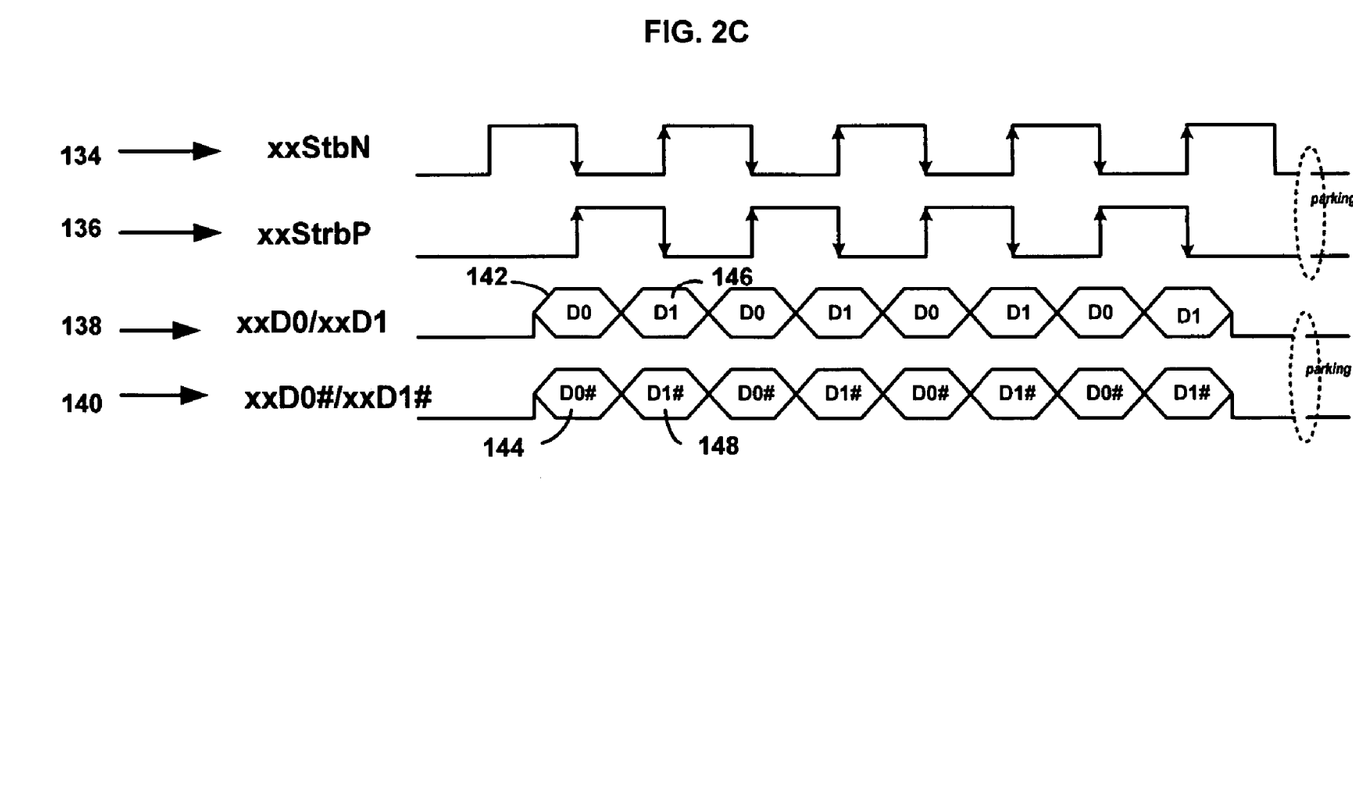
FIG. 2C illustrates a timing diagram for differential signaling.

In various embodiments, strobe inputs 12 are provided by the source of the data being transferred, to facilitate alignment with the centers of the data being transferred (see e.g. FIG. 2c). In other words, the data may be transferred source synchronously. Strobe inputs 12 may be provided in parallel with the data (requiring no extraction) or interleaved with the data (requiring extraction).

Multiplexors 18 are employed to configurably select and provide (e.g. Per control signal Diffen) the outputs of sense amplifier circuits 14 and 16 as strobe signals P 20 and N 22 for the differential signaling mode and the single-ended signaling mode, respectively.

Configuration of input section 10 may be effectuated in any one of a number of manners, including but not limited to the setting of one or more control bits in a configuration register (not shown) of the IC, or fusing of one or more fuses (not shown) of the IC. In various embodiments, the configuration register or the fuses may be configured to cause the control signal Diffen to assume a value of "1" to configure input section 10 to operate in a differential signaling mode, and a value of "0" to configure input section 10 to operate in a single-ended signaling mode.

FIGS. 2A and 2B illustrate input section 10 in further detail, in particular sense amplifier circuits 14 and 16 and latch banks 26, according to some embodiments of the invention. As described earlier, 16 latch banks 26 are illustrated for the embodiments, the latch banks 26 divided into two groups of even and odd latch banks. Further, as illustrated in FIG. 2B, for the embodiment, each group of latch banks contain 8 deskewing latches 106 for capturing bit data received via data paths 27. As described earlier (regarding latch banks 26) deskewing latches 106 latch data off data paths 27 in accordance with enabling pulse clocks 28, more specifically, enabling pulse clocks En0–En15. In various embodiments, a set of enabling pulse clocks En0–En15 is provided in a predetermined time period, e.g. two bus clock cycles. More, enabling pulse clocks En0–En15 may be configurably provided in one of at least two manners, a manner suitable for differential signaling and another manner suitable for single-ended signaling. In the former case, enabling pulse clocks En0–En15 may be provided in 16 points in time during the period, one enabling pulse clock per point in time, whereas in the later case, enabling pulse clocks En0–En15 may be provided in 8 points in time during the period, two enabling pulse clock per point in time, to be described more fully below.

For the embodiment, once latched, the data are stored in each of the deskewing latches 106 for at least one bus clock cycle. The stored data may be subsequently transferred in turn onto bus 30 using selectors 104. Further, for the embodiment, bit inversion circuitry 105 may also be provided for each latch bank 26 to reduce switching noise.

As illustrated in FIG. 2A, for the embodiment, data are provided to the 16 latch banks 26 via 16 corresponding data paths 27. The 16 data paths 27 are employed to provide data for single-ended signaling as well as differential signaling. In the former case, each data path provides 1 bit of data, xxD0, xxD1, and so forth. In the latter case, in general, two adjacent data paths are employed to provide 1 bit of data (xxDi and xxDi#). However, to achieve at least the same data transfer rate for a given set of pins (16 for the embodiment), the embodiment is designed to allow data to be transmitted on each data path at twice the speed while operating in the differential signaling mode (as compared to the speed of transmission while operating in the single-ended mode). Thus, two streams of data bits may be multiplexed on each pair of data paths, xxD0/xxD1, xxD0#/xxD1#, xxD2/xxD3, xxD2#/xxD3#, and so forth.

As also illustrated in FIG. 2A, for the embodiment, each of sense amplifier circuits 16 includes sense amplifier 118 and 120, whereas each of sense amplifier circuits 14 includes sense amplifier 114 and 116. In the former case, each of sense amplifiers 118/120 receives one of the two strobe signals, and a Gunning Transceiver Logic ("GTL") signal (GTLREF) as a reference signal, and generates StbP/StbN based on the received signals. In the latter case, each of sense amplifiers 114 and 116 receives both two strobe signals, and generates StbP/StbN based on the received signals (in opposite manners).

For the embodiment, a squelching arrangement comprising squelch detector 122 and AND gates 124 and 126 may also be provided to ensure correct output of the StbP and StbN signals. More specifically, the squelching arrangement may be employed to squelch random noises, when the strobe signals are "parked", and prevent the random noises from being outputted as StbP and StbN. Further, for the embodiment, squelch detector 122 may be provided with a STOP signal denoting for squelch detector 122 a last valid strobe crossing edge. Typically, the STOP signal is provided by the data source.

Additionally, in alternate embodiments, sense amplifiers 114 and 116 along with the squelching arrangement may be disabled (as opposed to having their outputs ignored) when input section 10 is configured to operate in the single-ended signaling mode, and sense amplifiers 118 and 120 may be disabled (as opposed to having their outputs ignored) when input section 10 is configured to operate in the differential signaling mode.

Figure 3:
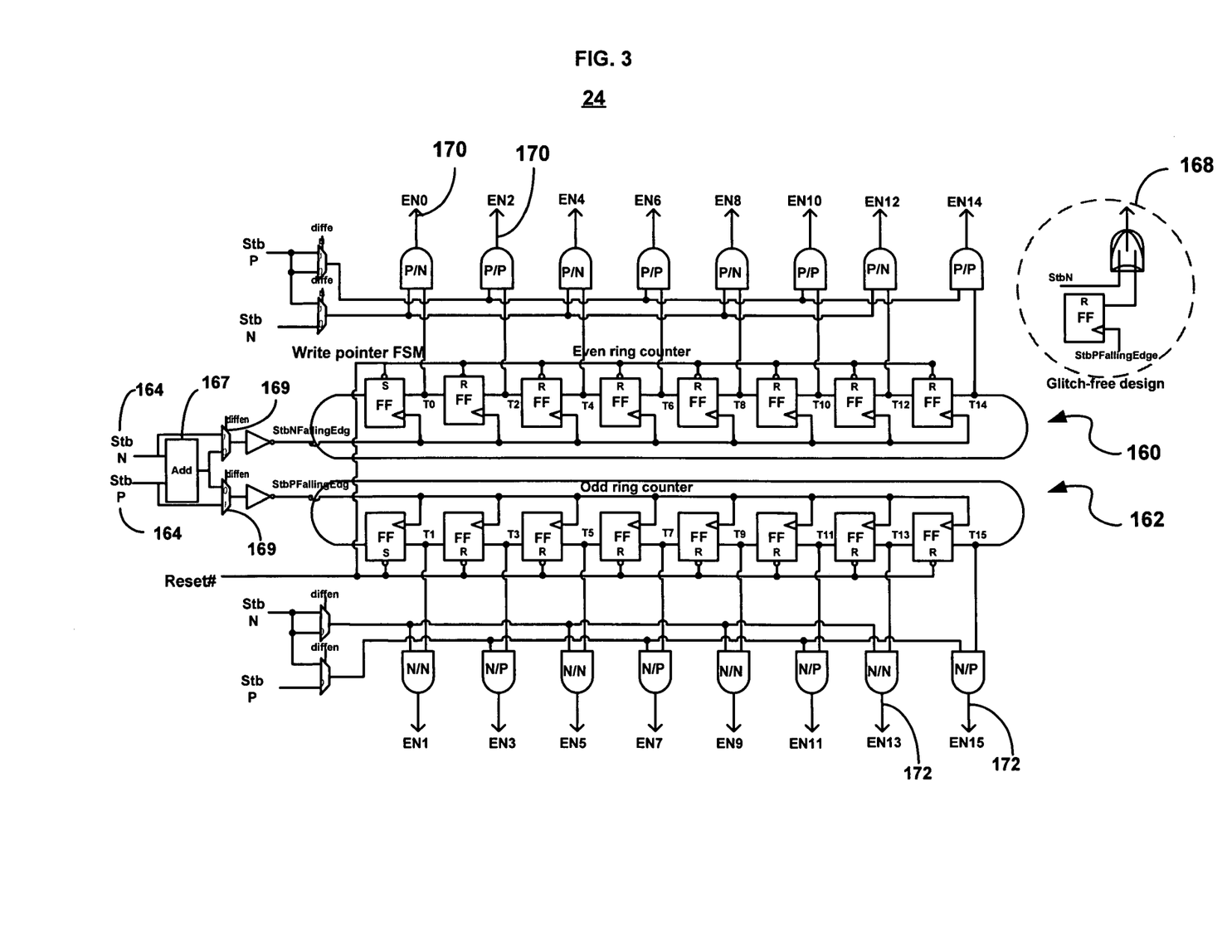
FIG. 3 illustrates the configurable enabling pulse clock generator of FIG. 1 in further detail, according to some embodiments of the invention.

FIG. 3 illustrates enabling pulse clock generator 24 in further detail, according to some embodiments of the invention. Recall enabling pulse clock generator 24 is employed to provide enabling pulse clocks to latch banks 26 to control their data latching operations. Further, enabling pulse clock generator 24 is advantageously designed to be able to configurably provide the enabling pulse clocks for a selected one of a differential signaling and a single-ended signaling mode of operation. More specifically, for the embodiments of FIGS. 1, 2A and 2B, enabling pulse clock generator 24 may be advantageously designed to be able to configurably provide a set of 16 enabling pulse clocks En–En15 in 16 points in time in a period, one enabling pulse clock per point in time for differential signaling, and in 8 points in time in a period, two enabling pulse clocks per point in time for single-ended signaling.

For the embodiment of FIG. 3, enabling pulse clock generator 24 includes add unit 167, selectors 169, ring counters 160 and 162, and two sets of logic elements 170 and 172, coupled to each other as shown. That is, logic element set 170 comprises the eight AND gates illustrated outputting En0, En2, . . . En14, and logic element set 172 comprises the eight AND gates outputting En1, En3, . . . En15.

Ring counters 160 and 162 are employed to generate the enabling pulse clocks. More specifically, ring counters 160 and 162 are designed to generate the enabling pulse clocks based on the StbNFallingEdge and StbPFallingEdge signals. For the embodiment, each of ring counters 160 and 162 includes 8 stages. Thus, if StbNFallingEdge and StbPFallingEdge are identical signals, each of ring counters 160 and 162 outputs 8 enabling pulse clocks (En0, En2, . . . . En14, or En1, En3, . . . En15) in 8 points in time during the period (for a corresponding even/odd bank of latch banks 26). However, if StbNFallingEdge and StbPFallingEdge are two different signals (e.g. 180 degrees out of phase), each of ring counters 160 and 162 outputs 8 enabling pulse clocks (En0, En2, . . . En14, or En1, En3, . . . En15) in 16 points in time during the period (for a corresponding even/odd bank of latch banks 26). In various embodiments, ring counters 160 and 162 may be implemented as Johnson counters.

Add unit 167 may be employed to generate the identical version of StbNFallingEdge and StbPFallingEdge based on the Stb N and Stb P signals 164.

Selectors 169 are employed to output a selected one of the StbN and the identical version, and a selected one of the StbP and the identical version, for ring counters 160 and 162 respectively, depending on the signaling mode (as denoted e.g. by the Diffen signal). More specifically, selectors 169 are employed to output the StbN and StbP signals as StbNFalling Edge and StbPFallingEdge for ring counters 160 and 162 respectively, when configured to operate in the single-end signaling mode, and two streams of the identical version as StbNFalling Edge and StbPFallingEdge for ring counters 160 and 162 respectively, when configured to operate in the differential signaling mode.

The two sets of AND gates 170 and 172 are employed to ensure the falling edge of each En signal is caused by the appropriate strobe signal. More specifically, for the embodiment, half of the set of AND gates 170 receives the StbP signal as one of the inputs, regardless of the signaling mode, whereas the other half receives the StbP signal as one of the inputs when generator 24 is configured to operate in the differential signaling mode, and the StbN signal as one of the inputs when generator 24 is configured to operate in the single-ended signaling mode. Complementarily, for the other set of AND gates 172, half receives the StbN signal as one of the inputs, regardless of the signaling mode, whereas the other half receives the StbN signal as one of the inputs when generator 24 is configured to operate in the differential signaling mode, and the StbP signal as one of the inputs when generator 24 is configured to operate in the single-ended signaling mode.

Further, for the embodiment, to facilitate improved operation in the single-ended signaling mode, a glitch design may be included for each output of each stage of ring counters 160 and 162.

Figure 4:
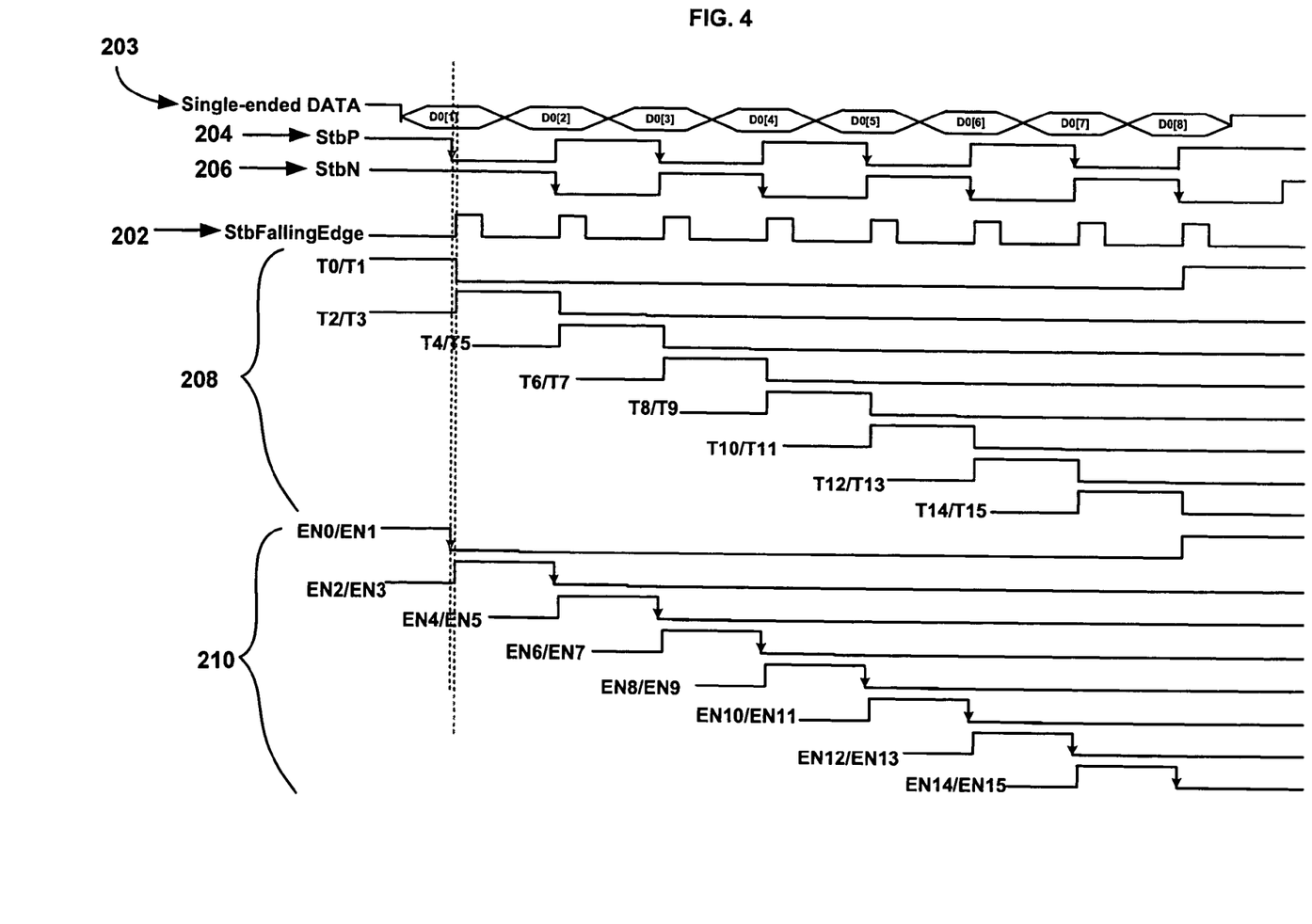
FIG. 4 illustrates timing diagrams for various signals when configured to operate in the single-ended signaling mode, according to some embodiments of the invention.

FIG. 4 depicts the timing of the various signals when enabling pulse clock generator 24 is configured to operate in the single-ended signaling mode according to some embodiments. For the illustrated embodiment, each of these timing diagrams 203, 204, 206, 208 and 210 represents a period of two bus clock cycles. In this example, 8 data bits 203 are to be latched and transferred during the period. When configured to operate in the single-ended signaling mode, StbFallingEdge pulses 202 may be formed based on the falling edges of StbP 204 and StbN 206 as shown. StbFallingEdge pulses 202 (the identical version of StbNFallingEdge and StbPFallingEdge) may then be fed into ring counters 160 and 162 to generate initial enabling pulses 208 (T0 T2 . . . T14 and T1 T3 . . . T15). These pulses when "AND'd" with the appropriate strobes result in clock pulses 210 (En0 En2 . . . En14 and En1 En3 . . . En15) at the 8 points in time during the period.

Figure 5:
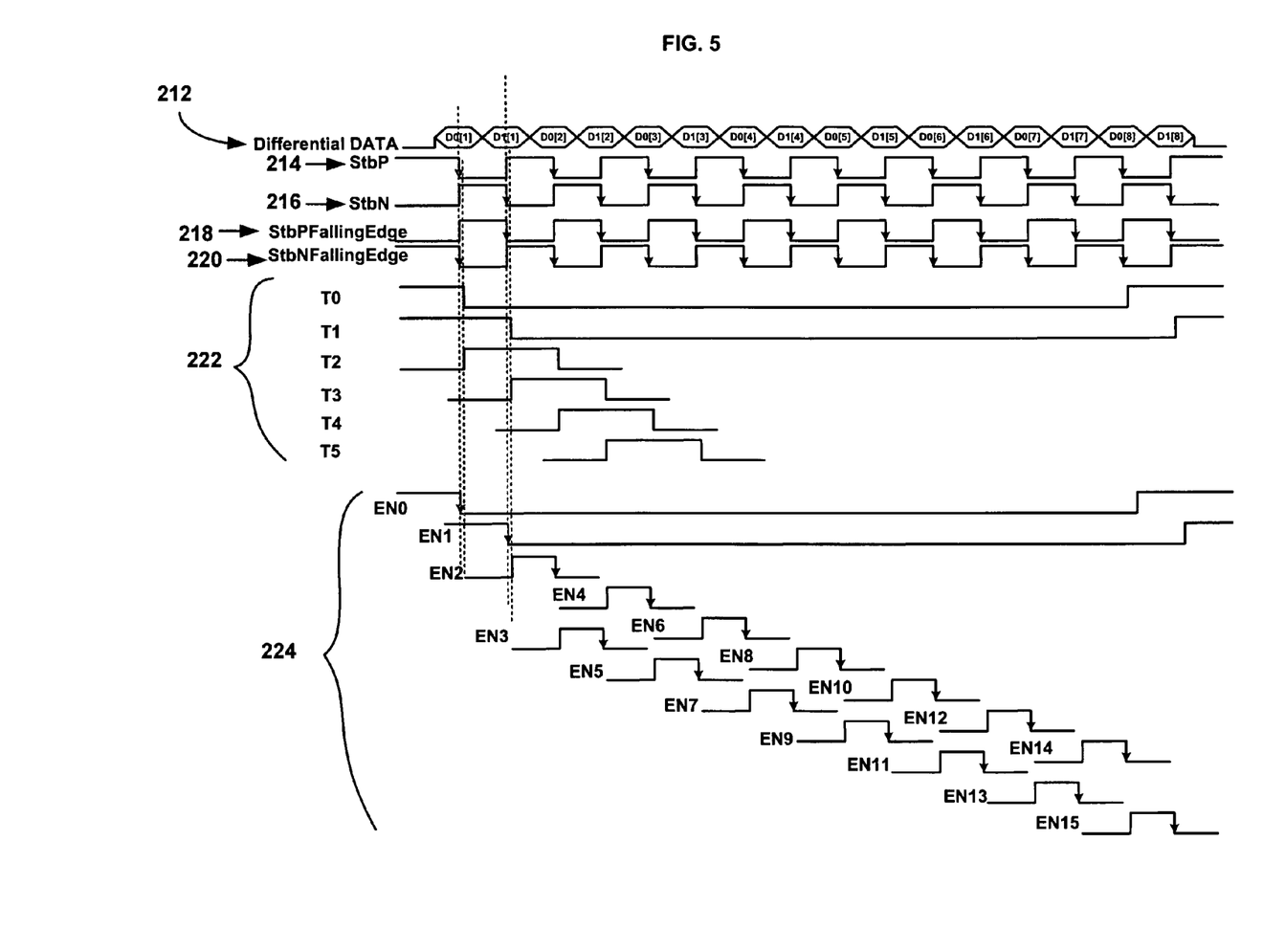
FIG. 5 illustrates timing diagrams for various signals when configured to operate in the differential signaling mode, according to some embodiments of the invention.

FIG. 5 depicts timing of the various signals when enabling pulse clock generator 24 is configured to operate in the differential signaling mode according to some embodiments. Similarly, for the illustrated embodiment, each of these timing diagrams 212, 218, 220, 222 and 224 represents a period of two bus clock cycles. In this example, two sets of 8 data bits 212 are to be interleavingly latched and transferred on during the period. When configured to operate in the differential signaling mode, StbPFallingEdge and StbNFallingEdge pulses, 218 and 220 respectively, may be formed based on StbP 204 and StbN 206 as shown. StbNFallingEdge and StbPFallingEdge pulses, 220 and 218 respectively, may then be fed into ring counters 160 and 162 to generate initial enabling pulses 222 (T0 T2 . . . T14 and T1 T3 . . . T15, respectively). These pulses when "AND'd" with the appropriate strobes result in clock pulses 224 (En0 En2 . . . En14 and En1 En3 . . . En 15) at the 16 points in time during the period.

Figure 6A:
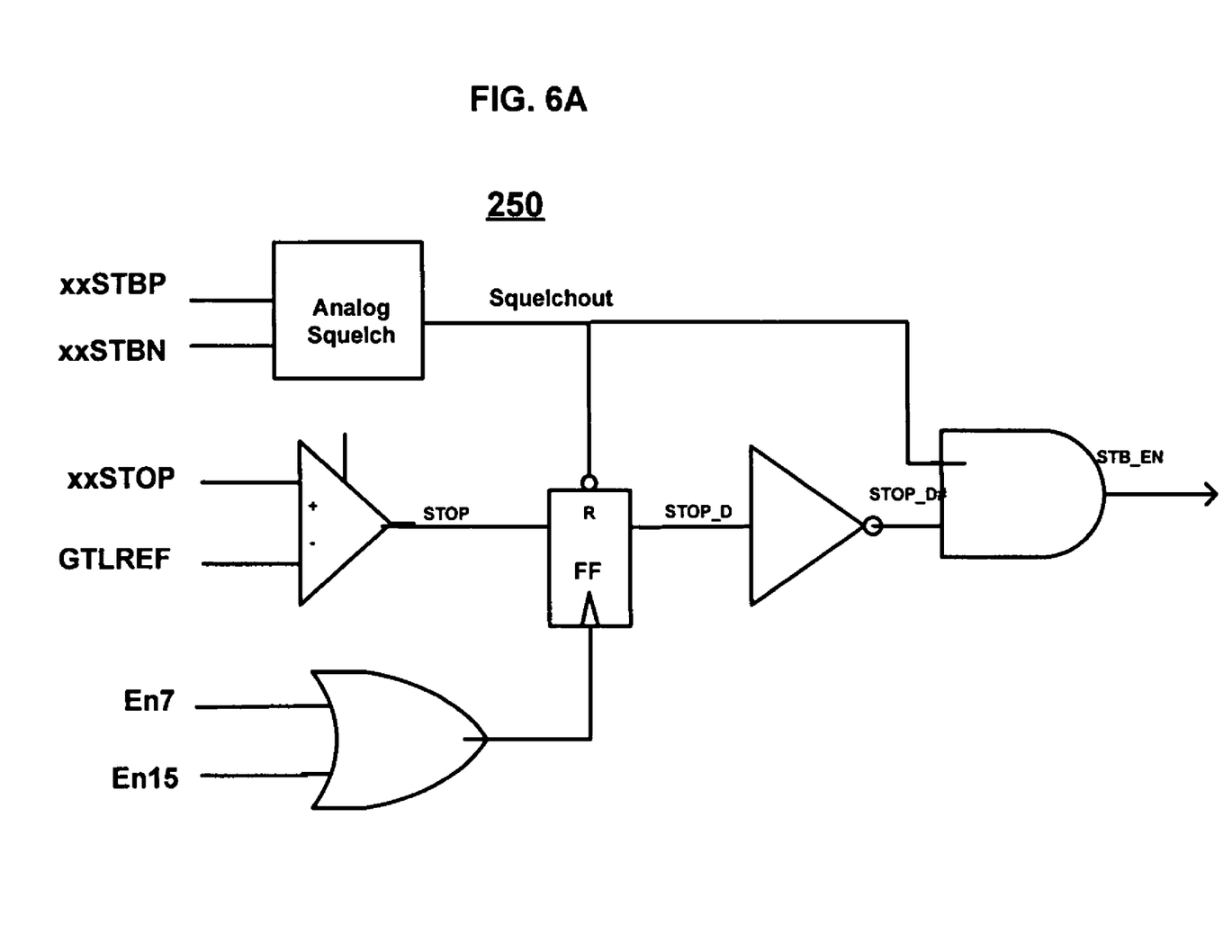
FIGS. 6A and 6B illustrate the squelch circuitry of FIG. 2A in further detail, and an associated timing diagram, according to some embodiments of the invention.
Figure 6B:
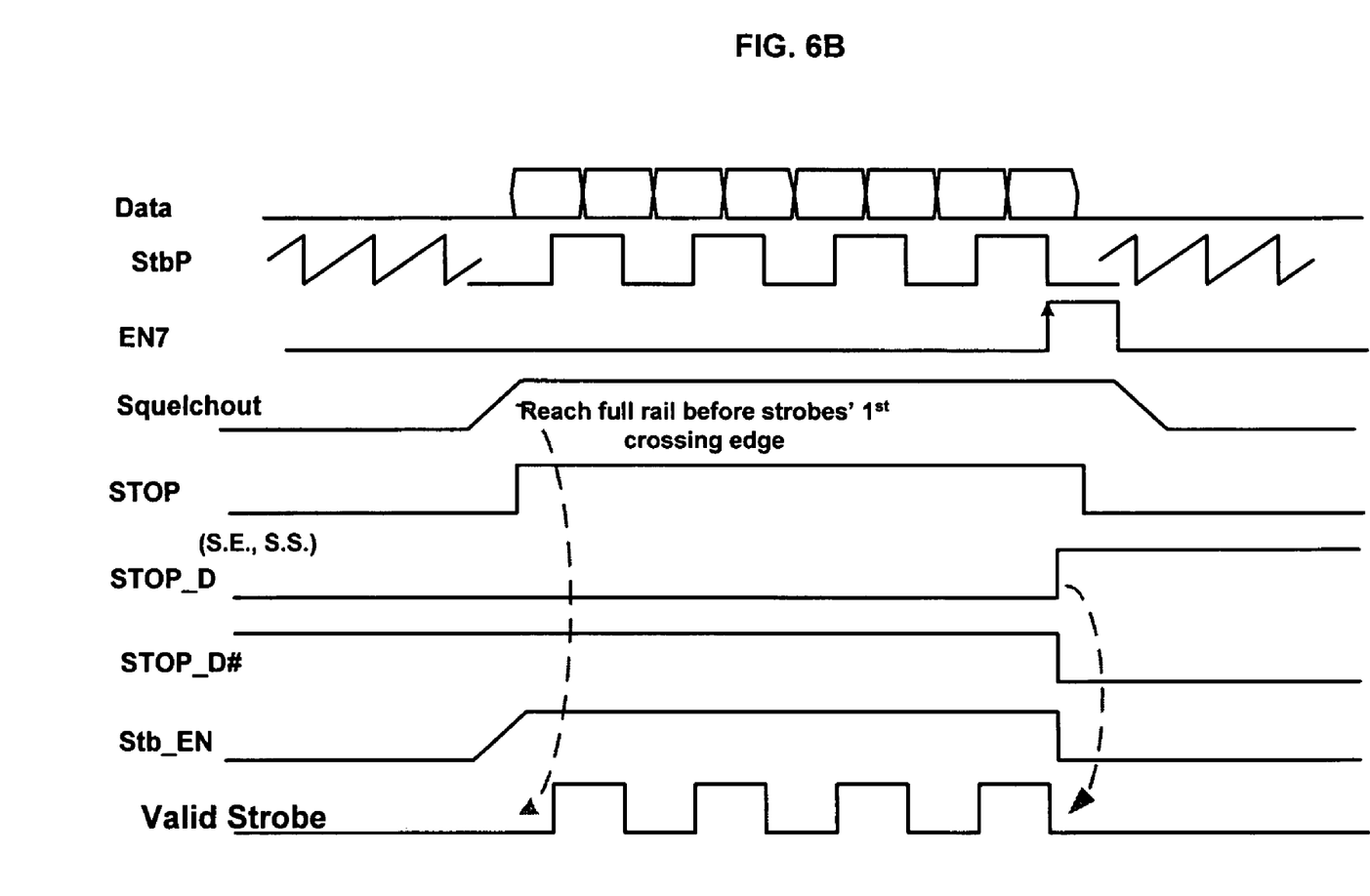

Referring now briefly back to FIG. 2A, recall that during the differential signaling mode of operation, strobes may not always be fully differential. A pair of strobes may be "parked" at low. Accordingly, a squelching arrangement may be employed to ensure only valid strobe signals (and not random noises) are outputted as StbN and StbP signals. FIGS. 6A and 6B depict one such arrangement in further detail, and timing of various signals, according to some embodiments of the invention.

Circuit 250 depicted in FIG. 6a is an analog squelch circuit. It employs the earlier described source synchronous STOP signal (provided by the data source) to detect the last valid crossing edge of the strobes. The embodiment also allows the data burst to be either 8 or 16. Accordingly, En7 and En15 are also sampled to determine whether the data source is sending the last chunk of data. If so, STOP_D shown in FIG. 6B may rise and close the stb_EN signal window. Stb_EN may then be ANDed with StbP/StbN to filter out false edges.

Figure 7:
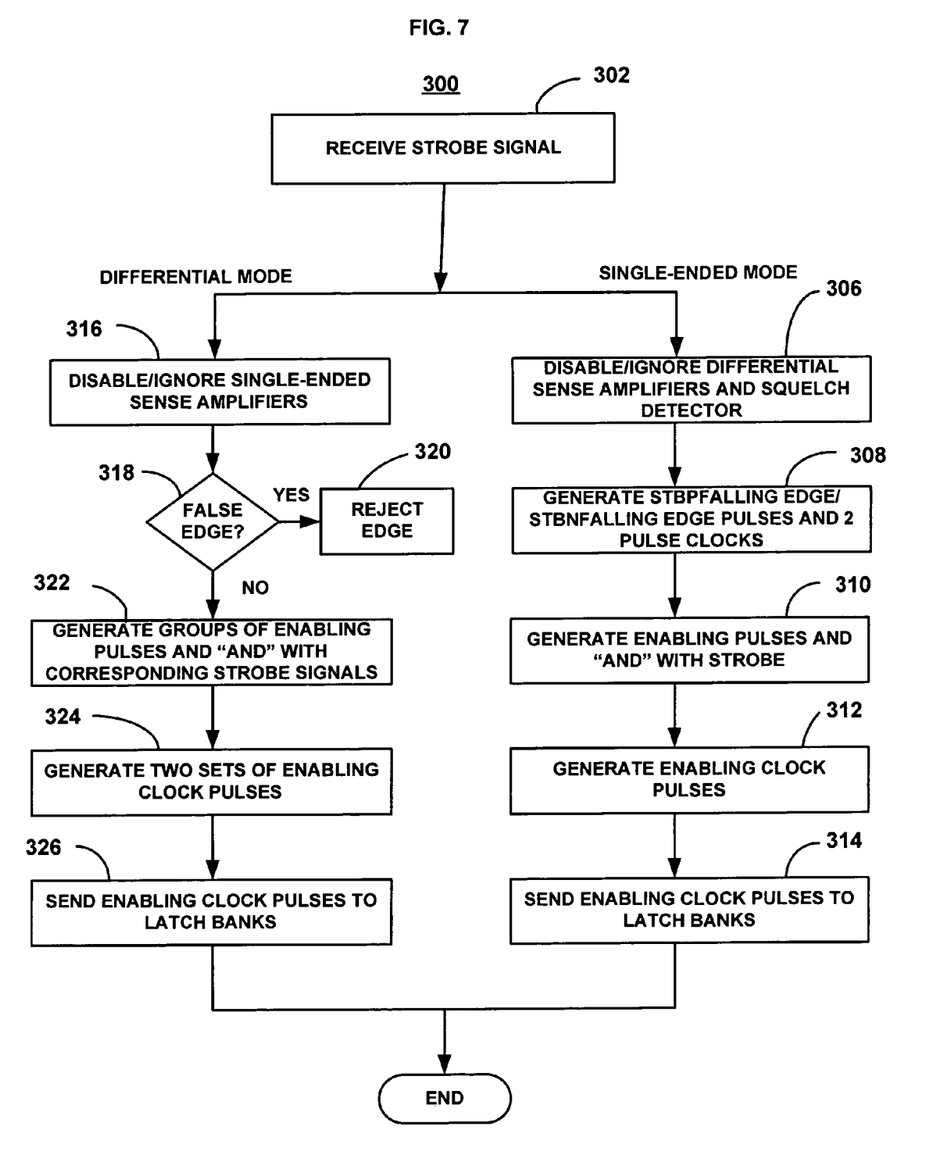
FIG. 7 is a flow diagram of a process for configurably generating enabling pulse clocks for different signaling modes, according to some embodiments of the invention.

FIG. 7 is a flow diagram 300 that illustrates a method of the invention, according to some embodiments of the invention. At 302, strobe signals are received from, for example, an external source. If the input section 10 is configured to operate in single-ended signaling mode, then differential sense amplifiers and squelch detector may be disabled or their outputs may be ignored at 306. Based on the strobe signals received, StbPFallingEdge/StbNFallingEdge pulses may be generated from the falling edges of StbP and StbN at 308. Each of the pulse clocks may then be fed into a ring counter to generate initial enabling pulse clocks at 310 (for an 8-bit embodiment, each ring counter may generate 16 enabling pulses in 8 points in time in a period). These enabling pulses may then be "AND'd" with strobes to generate the final enabling pulse clocks at 312. These enabling pulse clocks may then be sent to the latch banks at 314.

If input section 10 is configured to operate in the differential signaling mode, then single-ended sense amplifiers may be disabled or their outputs may be ignored at 316. A determination may be made at 318 as to whether the edges of the strobes received in the received clock signals are false edges. If so, the edge or edges may be rejected at 320.

The process continues until the true edge or edges are found. Once a true strobe edge or edges are found, two groups of initial enabling pulses may be generated from even and odd ring counters at 322 (for an 8-bit interleaved embodiment, each ring counter may generate 16 enabling pulses in 16 points in time in a period). Each group may be ANDed with its corresponding strobe signals. Based on the generated enabling pulses, two sets of enabling clock pulses may be generated such that the falling edges of these pulses may be determined by the corresponding strobes at 324. The enabling clock pulses are then sent to latch banks at 326.

Figure 8:
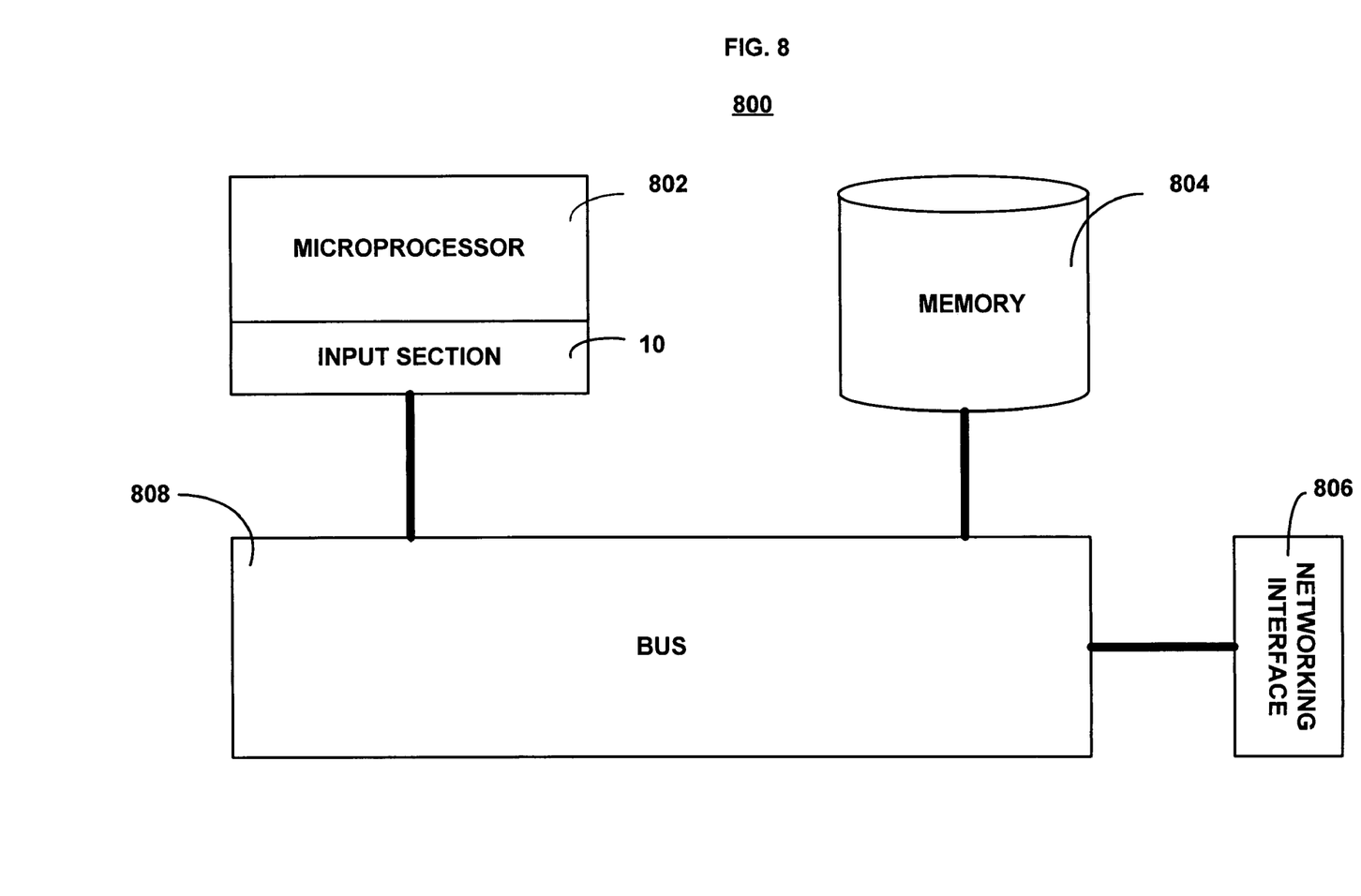
FIG. 8 is a block diagram of an example system, according to some embodiments of the invention.

FIG. 8 illustrates a system 800 in accordance with one embodiment. As illustrated, for the embodiment, system 800 includes microprocessor 802, memory 804, and networking interface 806 coupled to each other, via bus 808. For the embodiment, microprocessor 802 is advantageously equipped with input section 10 of FIG. 1. Further, it forms a portion of the interface between microprocessor 802 and bus 808. Accordingly, microprocessor 802 may be configured to accept data input under at least a differential signaling mode and a single-ended signaling mode.

Beside the advantageous incorporation of input section 10, microprocessor 802, memory 804, networking interface 806 and bus 808 all represent corresponding broad ranges of these elements known in the art or to be designed.

Depending on the applications, system 800 may include other components, including but are not limited to non-volatile memory, chipsets, mass storage (such as hard disk, compact disk (CD), digital versatile disk (DVD) and so forth), graphical or mathematic co-processors, and so forth. One or more of these components may also include input section 10.

In various embodiments, system 800 may be a personal digital assistant (PDA), a wireless mobile phone, a tablet computing device, a laptop computing device, a desktop computing device, a set-top box, an entertainment control unit, a digital camera, a digital video recorder, a CD player, a DVD player, or other digital device of the like.

Although specific embodiments have been illustrated and described herein, it will be appreciated by those of ordinary skill in the art that a wide variety of alternate and/or equivalent implementations calculated to achieve the same purposes may be substituted for the specific embodiments shown and described without departing from the scope of the present invention. This application is intended to cover any adaptations or variations of the embodiments discussed herein. Therefore, it is manifestly intended that this invention be limited only by the claims and the equivalents thereof.

What is claimed is:

1. An apparatus, comprising:
   a plurality of input latch banks; and
   a configurable enabling pulse clock generator coupled to the plurality of input latch banks to configurably generate enabling pulse clocks for the plurality of input latch banks for a configurably selected one of a first and a second signaling mode.

2. The apparatus of claim 1, wherein the first signaling mode is a differential signaling mode, and the second signaling mode is a single-ended signaling mode.

3. The apparatus of claim 1, wherein
   the plurality of input latch banks comprise 2n latch banks; and
   the configurable enabling pulse clock generator comprises a first and a second configurable ring counter arrangement, each coupled to a different n of the latch banks, to jointly generate 2n enabling pulse clocks in a selected one of 2n points in time of a period when the apparatus is configured to operate in the first signaling mode, one enabling pulse clock for each point in time, and n points in time of the period when the apparatus is configured to operate in the second signaling mode, two enabling pulse clocks for each point in time.

4. The apparatus according to claim 1, wherein the apparatus further comprises a first and a second set of sense amplifier circuit configurably coupled to the configurable enabling pulse clock generator for the first and the second signaling mode respectively, to provide the configurable enabling pulse clock generator with a first and a second strobe signal in accordance with the first and the second signaling mode respectively, on which, the configurable enabling clock pulse generator bases its generation of the enabling pulse clocks for the plurality of input latch banks.

5. The apparatus according to claim 4, wherein
   the first set of sense amplifier circuit comprises a first and a second sense amplifier configurably coupled to the configurable enabling pulse generator to provide the configurable enabling pulse generator with the first and second strobe signals for the first signaling mode; and
   the second set of sense amplifier circuit comprises a third and a fourth sense amplifier configurably coupled to the configurable enabling pulse generator to provide the configurable enabling pulse generator with the first and second strobe signals for the second signaling mode.

6. The apparatus according to claim 5, wherein the first set of sense amplifier circuit further comprises a squelching arrangement disposed in between the first and second sense amplifiers and the configurable enabling pulse clock generator to ensure correct provision of the first and second strobe signals to the configurable enabling pulse generator, the squelching arrangement including a squelch detector having a stop input that allows an external data provision source to denote a last valid strobe crossing edge.

7. The apparatus of claim 1, wherein the apparatus is a selected one of a microprocessor and a chipset.

8. A method comprising:
   generating a plurality of enabling pulse clocks for a selected one of a first and a second signaling mode, employing a configurable enabling pulse clock generator configurable to generate the enabling pulse clocks for the selected one of the first and second signaling modes; and
   latching a plurality of data bits based at least in part on the enabling pulse clocks.

9. The method of claim 8, wherein said generating comprises generating 2n enabling pulse clocks in a selected one of 2n points in time of a period when generating the enabling pulse clocks for the first signaling mode, one enabling pulse clock for each point in time, and n points in time of the period when generating the enabling pulse clocks for the second signaling mode, two enabling pulse clocks for each point in time.

10. The method according to claim 8, wherein the method further comprises providing a first and a second strobe signal for use to generate the enabling pulse clocks, configurably selected from outputs of a first and a second set of sense amplifier circuit.

11. A system, comprising:
    an integrated circuit having an input section, including
    a plurality of input latch banks; and
    a configurable enabling pulse clock generator coupled to the plurality of input latch banks to configurably generate enabling pulse clocks for the plurality of input latch banks for a configurably selected one of a first and a second signaling mode;
    a bus coupled to the integrated circuit; and
    a networking interface coupled to the bus.

12. The system of claim 11, wherein the bus is coupled to the integrated circuit at least in part through the input section, and the first and second signaling modes are a differential signaling mode, and a single-ended signaling mode respectively.

13. The system of claim 11, wherein
    the plurality of input latch banks comprise 2n latch banks; and
    the configurable enabling pulse clock generator comprises a first and a second configurable ring counter arrangement, each coupled to a different n of the latch banks, to jointly generate 2n enabling pulse clocks in a selected one of 2n points in time of a period when the IC is configured to operate in the first signaling mode, one enabling pulse clock for each point in time, and n points in time of the period when the IC is configured to operate in the second signaling mode, two enabling pulse clocks for each point in time.

14. The system according to claim 11, wherein the system further comprises a first and a second set of sense amplifier circuit configurably coupled to the configurable enabling pulse clock generator for the first and the second signaling mode respectively, to provide the configurable enabling pulse clock generator with a first and a second strobe signal in accordance with the first and the second signaling mode respectively, on which, the configurable enabling clock pulse generator bases its generation of the enabling pulse clocks for the plurality of input latch banks.

15. The system according to claim 14, wherein
the first set of sense amplifier circuit comprises a first and a second sense amplifier configurably coupled to the configurable enabling pulse generator to provide the configurable enabling pulse generator with the first and second strobe signals for the first signaling mode; and
the second set of sense amplifier circuit comprises a third and a fourth sense amplifier configurably coupled to the configurable enabling pulse generator to provide the configurable enabling pulse generator with the first and second strobe signals for the second signaling mode.

16. The system of claim 11, wherein the IC is a selected one of a microprocessor and a chipset.

17. The system of claim 11, wherein the system is a selected one of a wireless mobile phone, a personal digital assistant, a CD player, a DVD player, a digital camera, a set-top box and an entertainment control unit.

* * * * *

UNITED STATES PATENT AND TRADEMARK OFFICE
CERTIFICATE OF CORRECTION

PATENT NO.         : 7,038,505 B2                                      Page 1 of 1
APPLICATION NO. : 10/750558
DATED                : May 2, 2006
INVENTOR(S)       : Cole et al.

It is certified that error appears in the above-identified patent and that said Letters Patent is hereby corrected as shown below:

Figure 1
[Ref no.] 24 "...PULSE CLCOK..." should read --...PULSE CLOCK...--

Column 3
Line 17, "...earlier, 16 latch banks 26..." should read --...earlier, 16 [no bold] latch banks 26...--.
Line 45, "...via 16 corresponding..." should read --...via 16 [no bold] corresponding...--.

Column 5
Line 32, "...a glitch design may..." should read --...a glitch design 168 may...--.
Line 63, "...StbP 204 and StbN 206..." should read --...StbP214 and StbN 216...--.

Signed and Sealed this

Thirty-first Day of July, 2007

JON W. DUDAS
*Director of the United States Patent and Trademark Office*